United States Patent
Nishitani et al.

(10) Patent No.: US 7,436,682 B2
(45) Date of Patent: Oct. 14, 2008

(54) WIRING BOARD, ELECTRONIC COMPONENT MOUNTING STRUCTURE, AND ELECTRONIC COMPONENT MOUNTING METHOD

(75) Inventors: Yuji Nishitani, Kanagawa (JP); Tomoshi Ohde, Tokyo (JP)

(73) Assignees: Sony Computer Entertainment Inc., Tokyo (JP); Sony Corporation, Tokyo (JP)

( * ) Notice: Subject to any disclaimer, the term of this patent is extended or adjusted under 35 U.S.C. 154(b) by 0 days.

(21) Appl. No.: 11/600,928

(22) Filed: Nov. 16, 2006

(65) Prior Publication Data
US 2007/0119618 A1 May 31, 2007

(30) Foreign Application Priority Data
Nov. 25, 2005 (JP) ............................ 2005-340526

(51) Int. Cl.
*H05K 7/12* (2006.01)
(52) U.S. Cl. .................. 361/768; 361/760; 361/767; 174/260
(58) Field of Classification Search ............... 257/778; 438/106, 119, 617; 361/768, 760, 767; 174/260
See application file for complete search history.

(56) References Cited

U.S. PATENT DOCUMENTS

| | | | | |
|---|---|---|---|---|
| 3,380,155 A | * | 4/1968 | Burks | ...................... 438/617 |
| 5,637,535 A | * | 6/1997 | Matsuda et al. | ............. 438/106 |
| 5,666,008 A | * | 9/1997 | Tomita et al. | ................ 257/678 |
| 5,684,677 A | * | 11/1997 | Uchida et al. | ................ 361/770 |
| 5,937,277 A | * | 8/1999 | Matsuda et al. | ............. 438/119 |
| 7,026,188 B2 | * | 4/2006 | Taguchi et al. | .............. 438/108 |

FOREIGN PATENT DOCUMENTS

JP 9-246319 9/1997

\* cited by examiner

*Primary Examiner*—Dean A. Reichard
*Assistant Examiner*—Andargie M Aychillhum
(74) *Attorney, Agent, or Firm*—Katten Muchin Rosenman LLP

(57) ABSTRACT

A flip chip mounting method for improving the accuracy of positioning of a semiconductor chip and avoiding a short circuit between protruding electrodes even when the protruding electrodes are formed at smaller spacings. The method comprises: placing a semiconductor chip on a wiring board, the semiconductor chip having protruding electrodes formed at a relatively small spacing and at a relatively large spacing, the wiring board having electrode pads corresponding to the respective protruding electrodes and solder pieces formed on the respective pads; heating the semiconductor chip and the wiring board to a temperature at which only the solder pieces on the electrode pads of greater spacing melt; performing self alignment of the semiconductor chip by the melted solder pieces; and heating the semiconductor chip and the wiring board further to a temperature at which the protruding electrodes and the solder pieces on the electrode pads of smaller spacing melt.

9 Claims, 4 Drawing Sheets

WIRING BOARD, ELECTRONIC COMPONENT MOUNTING STRUCTURE, AND ELECTRONIC COMPONENT MOUNTING METHOD

BACKGROUND OF THE INVENTION

1. Field of the Invention

The invention relates to a wiring board, an electronic component mounting structure, and an electronic component mounting method for mounting electronic components. In particular, the invention relate to improving the accuracy of positioning of electronic components in an electronic component mounting structure and an electronic component mounting method.

2. Description of the Related Art

Recently, electronic devices such as computers, cellular phones, and personal digital assistants (PDAs) have been miniaturized, sophisticated, and speeded up. Further miniaturization, higher speeds, and higher densities have thus been required of semiconductor apparatuses that incorporate ICs (integrated circuits), LSIs (Large-Scale ICs), and other semiconductor chips intended for use in such electronic devices. With the miniaturization and increasing density of these semiconductor apparatuses, a flip chip mounting method has been increasingly used where semiconductor chips are provided with protruding electrodes and are surface mounted onto a wiring board with their protruding electrode sides facing downward (see Japanese Patent Laid-Open Publication No. Hei 09-246319).

In the conventional flip chip mounting structure and method, the possibility has existed that slight displacement of semiconductor chips placed on a wiring board creates solder contacts or bridges between adjoining bumps when the bumps are formed at smaller spacings. This slight displacement has produced problems such that it has been difficult to miniaturize the semiconductor apparatuses, and that semiconductor apparatus manufacturing yields have therefore dropped.

SUMMARY OF THE INVENTION

The present invention has been developed in view of the foregoing problems. It is thus a general purpose of the present invention to provide a wiring board, an electronic component mounting structure, and an electronic component mounting method for improving the accuracy of positioning of semiconductor chips, thereby preventing a short circuit from occurring between bumps even when the bumps, are formed at smaller spacings.

One embodiment of the present invention is a wiring board. This wiring board is for mounting an electronic component having a plurality of protruding electrodes formed at different spacings, the wiring board comprising: electrode pads corresponding to the protruding electrodes; and solder pieces formed on the electrode pads, wherein the solder pieces on electrode pads of greater spacing have a melting point lower than that of the solder pieces on electrode pads of smaller spacing.

According to this embodiment, it is possible to melt only the solder pieces on the electrode pads of greater spacing when mounting a high-pin-count electronic component. This can improve the alignment precision of the electronic component placed on the wiring board without creating a bridge or the like between the protruding electrodes.

In the foregoing embodiment, some or all of the electrode pads of greater spacing may be used only to fix the electronic component, and not to establish electrical connection with the electronic component. The electrode pads intended only to fix the electronic component, not to establish electrical connection with the electronic component, are so-called dummy pads. According to this embodiment, dummy pads can be formed in desired positions on the wiring board without being restricted by the position or arrangement of the electrical connection between the electronic component and the wiring board. It is therefore possible to improve the freedom of design of the wiring board and positioning of the electronic components.

Another embodiment of the present invention is an electronic component mounting structure. This electronic component mounting structure is a structure including a wiring board and an electronic component mounted thereon wherein: a plurality of protruding electrodes formed on the electronic component at different spacings are joined to solder pieces on electrode pads formed on the wiring board so as to correspond to the respective protruding electrodes; and the solder pieces on electrode pads of greater spacing have a melting point lower than that of the solder pieces on electrode pads of smaller spacing and that of the protruding electrodes.

According to this embodiment, it is possible to provide an electronic component mounting structure in which an electronic component is mounted on a wiring board with high accuracy without creating a bridge or the like between the protruding electrodes. Since the self alignment of the electronic component suppresses the creation of bridges and the like between the protruding electrodes of narrower pitch, it is possible to contribute to the miniaturization and increasing density of semiconductor apparatuses.

In the foregoing embodiment, some or all of the electrode pads of greater spacing may be used only to fix the electronic component, and not to establish electrical connection with the electronic component. According to this embodiment, dummy pads can be formed in desired positions on the wiring board without being limited to positions or arrangements determined for the sake of electrical connection between the electronic component and the wiring board. It is therefore possible to improve the freedom of design of the electronic component mounting structure.

Yet another embodiment of the present invention is an electronic component mounting method. This electronic component mounting method comprises: placing an electronic component on a wiring board, the electronic component having a plurality of protruding electrodes formed at different spacings, the wiring board having electrode pads corresponding to the respective protruding electrodes and solder pieces formed on the respective electrode pads; heating the electronic component and the wiring board to a temperature at which only the solder pieces on the electrode pads of greater spacing melt; performing self alignment of the electronic component by means of the melted solder pieces; and heating the electronic component and the wiring board further to a temperature at which the protruding electrodes and the solder pieces on the electrode pads of smaller spacing melt.

According to this embodiment, it is possible to manufacture a semiconductor apparatus having the electronic component mounting structure where an electronic component is mounted on a wiring board with high accuracy without causing a bridge or the like between the protruding electrodes. The self alignment of the electronic component, effected by melting only the solder pieces on the electrode pads of greater spacing, suppresses the creation of bridges and the like between the protruding electrodes of narrower pitch. It is therefore possible to contribute to the miniaturization and increasing density of semiconductor apparatuses.

The foregoing embodiment may employ a wiring board in which some or all of the electrode pads of greater spacing are used only to fix the electronic component, and not to establish electrical connection with the electronic component. According to this embodiment, dummy pads can be formed in desired positions on the wiring board without being restricted by the position or arrangement of the electrical connection between the electronic component and the wiring board. It is therefore possible to improve the freedom of design of the electronic component mounting structure.

In each of the foregoing embodiments, the electronic component may be a semiconductor chip such as an integrated circuit (IC) and a large-scale integrated circuit (LSI) of flip chip mounting type which are mounted with their electrode side facing toward the wiring board. This provides an improvement to the alignment precision when mounting the semiconductor chip, without causing a bridge or the like between the protruding electrodes.

It should also be appreciated that any appropriate combinations of the foregoing elements are also intended to fall within the scope of the invention covered by a patent to be claimed by this patent application.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 3 is a plan view showing the surface of a wiring board for the semiconductor chip to be mounted on;

DETAILED DESCRIPTION OF THE INVENTION

The invention will now be described by reference to the preferred embodiments. This does not intend to limit the scope of the present invention, but to exemplify the invention.

Hereinafter, an embodiment of the present invention will be described with reference to the drawings.

Figure 1:
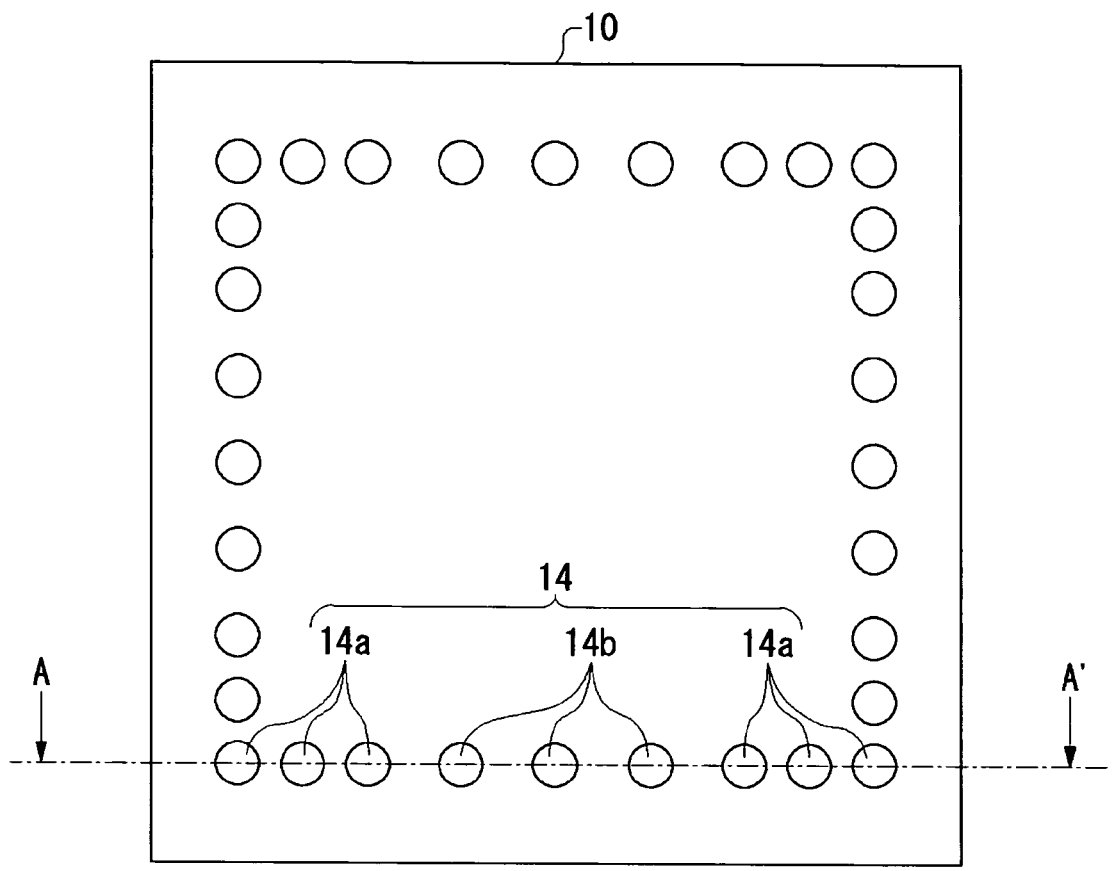
FIG. 1 is a plan view of a semiconductor chip according to an embodiment, showing the surface of the semiconductor chip on which electrode terminals are formed.
Figure 2:
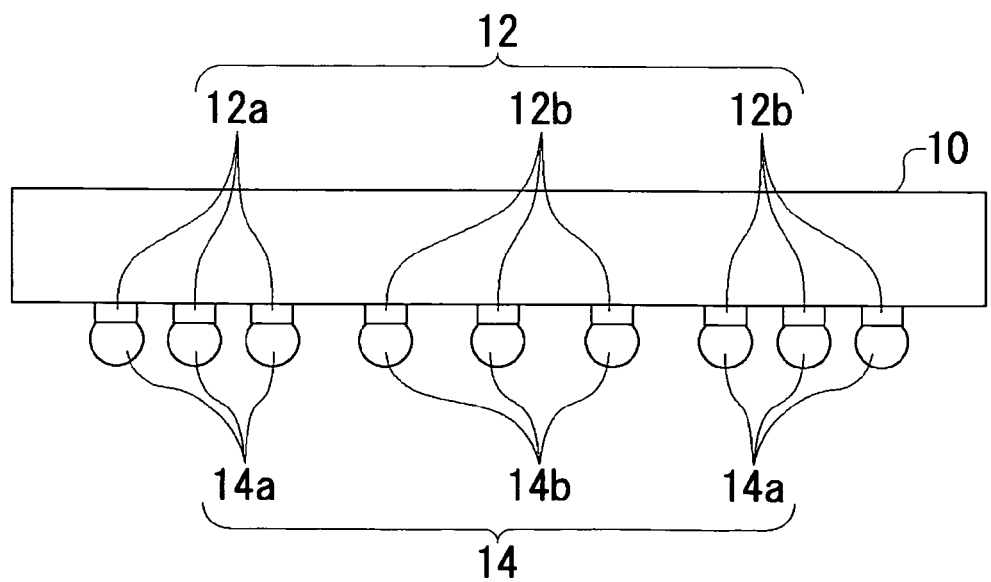
FIG. 2 is a sectional view taken along the line A-A' of the semiconductor chip shown in FIG. 1.

FIG. 1 is a plan view of a semiconductor chip 10 according to the embodiment, showing the surface of the semiconductor chip 10 on which electrode terminals are formed. FIG. 2 is a sectional view taken along the line A-A' of the semiconductor chip 10 shown in FIG. 1. The semiconductor chip 10 has electrode terminals 12 for inputting and outputting electrical signals. Protruding electrodes 14 of spherical shape, called bumps, are formed on the respective electrode terminals 12. The electrode terminals 12 of the semiconductor chip 10 according to the present embodiment include electrode terminals 12a and electrode terminals 12b which are formed at different spacings. The protruding electrodes 14 include protruding electrodes 14a and 14b of different spacings. The electrode terminals 12a and the protruding electrodes 14a are formed at a spacing or pitch smaller than that of the electrode terminals 12b and the protruding electrodes 14b, respectively. In the present embodiment, the protruding electrodes 14a are formed at a spacing of 150 µm. The protruding electrodes 14b are formed at a spacing of 300 µm. The protruding electrodes 14 are not limited to any particular material, however, in the present embodiment, Sn0.75Cu is used.

Figure 3:
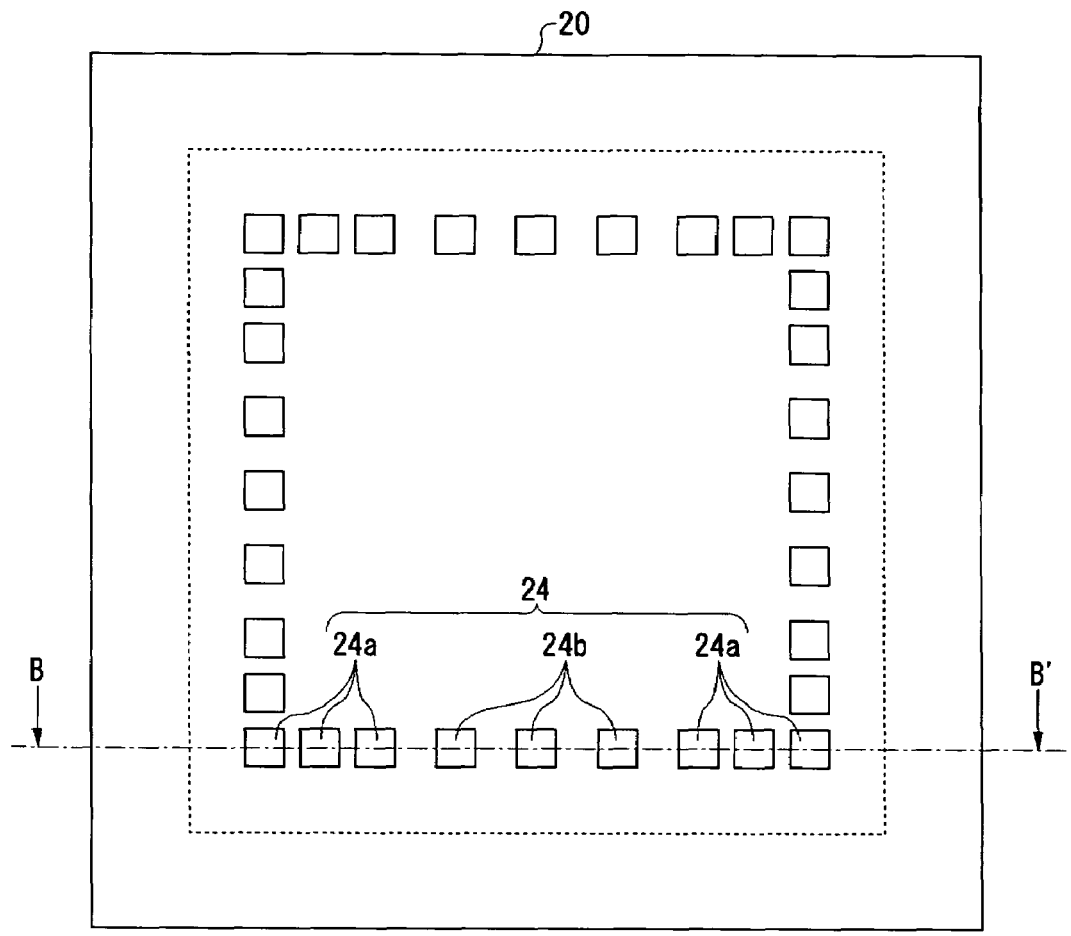
Figure 4:
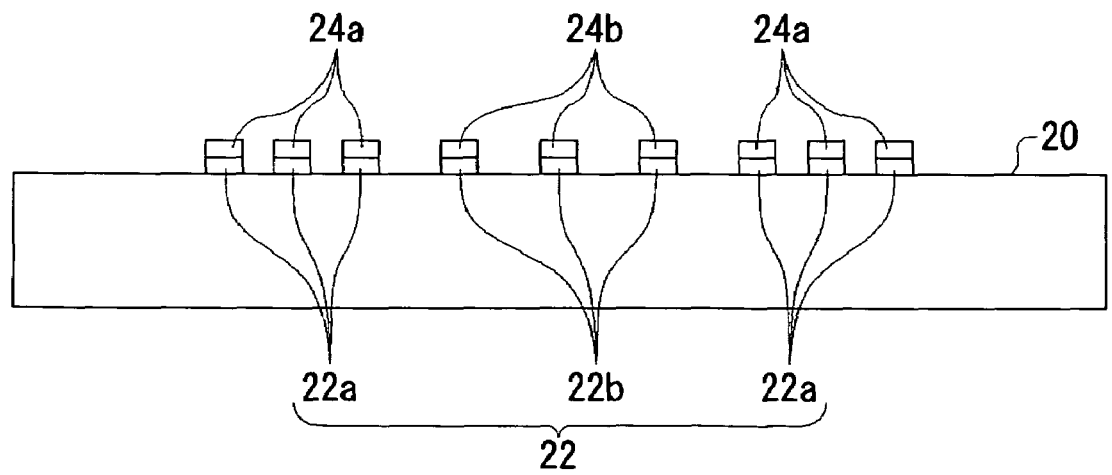
FIG. 4 is a sectional view taken along the line B-B' of the wiring board shown in FIG. 3.

FIG. 3 is a plan view showing the surface of a wiring board 20 for the semiconductor chip 10 to be mounted on. FIG. 4 is a sectional view taken along the line B-B' of the wiring board 20 shown in FIG. 3. The wiring board 20 has electrode pads 22 and solder pieces 24 formed on the respective electrode pads 22 that correspond to the protruding electrodes 14 formed on the semiconductor chip 10. More specifically, the electrode pads 22 include electrode pads 22a that are formed at a relatively small spacing or pitch, and electrode pads 22b that are formed at a relatively large spacing or pitch. The solder pieces 24 include solder pieces 24a that are formed at a relatively small spacing or pitch, and solder pieces 24b that are formed at a relatively large spacing or pitch. The solder pieces 24a and 24b are made of materials having different melting points. The solder pieces 24b corresponding to the protruding electrodes 14b of relatively large spacing are made of a material having a melting point lower than that of the solder pieces 24a corresponding to the protruding electrodes 14a of relatively small spacing and that of the protruding electrodes 14. Consider the example where the protruding electrodes 14 are made of Sn0.75Cu which has a melting point of around 229° C. In such an example, it would be preferable that the solder pieces 24a be made of the same Sn0.75Cu as the protruding electrodes 14 are, and the solder pieces 24b be made of Sn3.5Ag which has a melting point of 223° C. It should be appreciated that the solder pieces 24 can be formed on the electrode pads 22 by such means as printing the solder pieces 24a and the solder pieces 24b onto the wiring board 20 by two separate steps.

FIGS. 5A to 5D are process diagrams showing a method by which the semiconductor chip 10 is mounted onto the wiring board 20 in a flip-chip fashion.

Figure 5A:
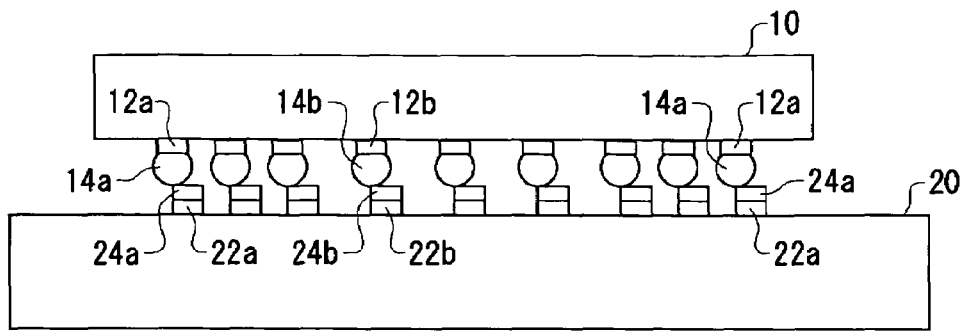
FIGS. 5A to 5D are process diagrams showing a method by which the semiconductor chip is mounted on the wiring board in a flip-chip fashion.

Initially, as shown in FIG. 5A, the semiconductor chip 10 is placed on the wiring board 20. It is generally desirable that the semiconductor chip 10 be placed so that the positions of the protruding electrodes 14 coincide with those of the solder pieces 24 corresponding to the protruding electrodes 14. The process diagrams show, however, the state where the positions of the protruding electrodes 14 are off the positions of the corresponding solder pieces 24. Such a displacement of the protruding electrodes 14 can easily occur when the semiconductor chip 10 is placed on the wiring board 20 with an insufficient positioning accuracy, or when the semiconductor chip 10 may be properly placed on the wiring board 20 but undergoes small vibrations or the like during transportation etc.

Figure 5B:
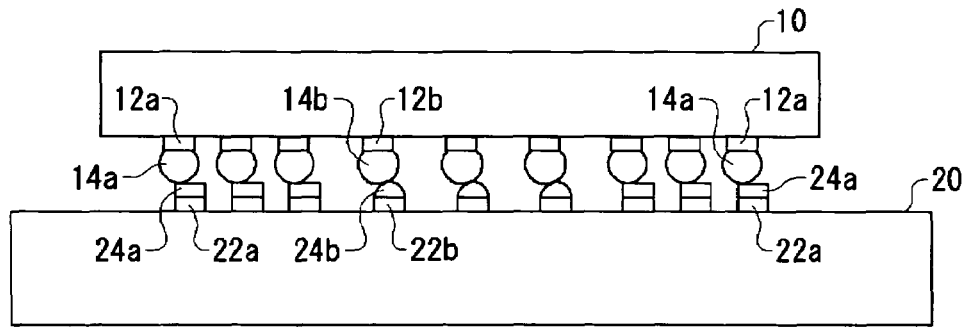

Next, as shown in FIG. 5B, the semiconductor chip 10 and the wiring board 20 are heated up at a rate of 1 to 2° C./sec in a heating system such as a reflow furnace. At temperatures higher than or equal to the melting point of the solder pieces 24b and below the melting point of the solder pieces 24a and the protruding electrodes 14, the heating rate is preferably lowered to, for example, 0.5° C./sec. This makes it possible to reliably maintain only the solder pieces 24b in a melted state. The temperature may also be temporarily kept constant in the temperature range of from the melting point of the solder pieces 24b to below the melting point of the solder pieces 24a and the protruding electrodes 14.

Figure 5C:
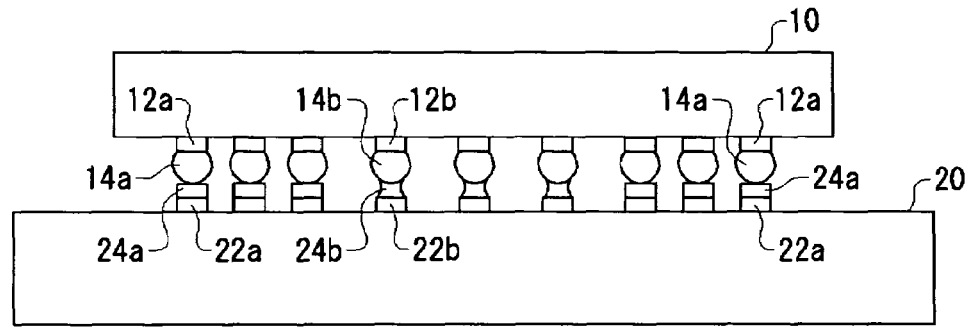

In the temperature range of from the melting point of the solder pieces 24b to below the melting point of the solder pieces 24a and the protruding electrodes 14, the solder pieces 24b are alone melted while the solder pieces 24a and the protruding electrodes 14 remain solid. As shown in FIG. 5C, this makes the electrode pads 22b and the protruding electrodes 14b wet with the melted solder pieces 24b, in which state the surface tensions of the melted solder pieces 24b act to move the semiconductor chip 10 into a stable position. That is, the centers of the solder pieces 24b generally coincide with the centers of the protruding electrodes 14b that are opposed to the respective solder pieces 24b. As a result, the position of the semiconductor chip 10 is corrected automatically even if the semiconductor chip 10 is placed on the wiring board 20 with some degree of displacement. Such automatic correction of position of the semiconductor chip 10 on the wiring board 20 will be referred to as self alignment. Since the protruding electrodes 14b and the solder pieces 24b are formed at relatively large spacings, the adjoining protruding electrodes 14b or the adjoining solder pieces 24b are prevented from creating a solder contact or bridge therebetween during the self alignment.

Figure 5D:
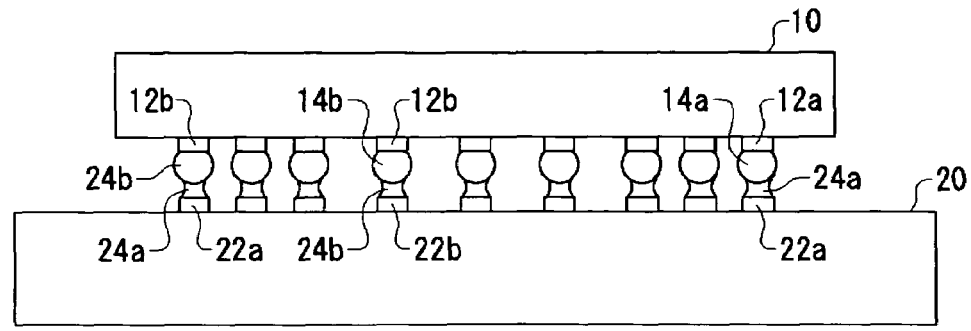

Next, the semiconductor chip 10 and the wiring board 20 are heated to a temperature higher than or equal to the melting point of the solder pieces 24a and the protruding electrodes 14. As shown in FIG. 5D, the solder pieces 24a, the solder pieces 24b, the protruding electrodes 14a, and the protruding electrodes 14b are thereby melted, so that the solder pieces 24a and the protruding electrodes 14a are joined to each other and the solder pieces 24b and the protruding electrodes 14b are joined to each other. In this instance, the protruding electrodes 14a of relatively small spacing and the solder pieces 24a opposed to the protruding electrodes 14a are already corrected in position by the self alignment. This suppresses the occurrence of a solder contact or a bridge between adjoining protruding electrodes 14a or adjoining solder pieces 24a.

Through the foregoing processes, it is possible to provide a flip chip mounting structure where the semiconductor chip 10 is mounted on the wiring board 20 with high accuracy without creating a bridge between the protruding electrodes 14. Since the self alignment of the semiconductor chip 10 suppresses the occurrence of bridges and the like between the protruding electrodes 14a of narrower pitch, it is possible to contribute to the miniaturization and increasing density of semiconductor apparatuses.

To ensure the effect of the self alignment shown in FIG. 5C, the amount of displacement between the semiconductor chip 10 and the wiring board 20 in FIG. 5A needs to satisfy a predetermined condition. Specifically, the amount of displacement must be such that the protruding electrodes 14b are at least in contact with the corresponding solder pieces 24b.

It is also desirable that the solder pieces 24a have smooth surfaces. This reduces the friction between the spherical protruding electrodes 14a and the solder pieces 24a, making it possible for the semiconductor chip 10 to move smoothly during self alignment. The displacement correction by means of the self alignment can thus be more reliably performed. More specifically, the spherical shape of the protruding electrodes 14a contributes to the smooth movement of the semiconductor chip 10 during self alignment as it decreases the contact areas between the protruding electrodes 14a and the solder pieces 24a.

The foregoing embodiment has dealt with the case where the protruding electrodes 14 are used to establish electrical connection between the semiconductor chip 10 and the wiring board 20. However, the present invention is not limited thereto. For example, some or all of the protruding electrodes 14b of relatively large spacing may be formed as dummy bumps, and the corresponding electrode pads 22b as dummy electrode pads. Then, the dummy protruding electrodes 14b and the dummy electrode pads 22b are used to fix the semiconductor chip 10, not to establish electrical connection between the semiconductor chip 10 and the wiring board 20. Consequently, the dummy protruding electrodes 14b and the dummy electrode pads 22b can be formed in desired positions on the wiring board 10 without being limited to positions or arrangements determined for the purpose of electrical connection between the semiconductor chip 10 and the wiring board 20. This can improve the freedom of design of the wiring board and positioning of the electronic component.

The present invention is not limited to the foregoing embodiments, and various modifications including design changes may be made thereto based on the knowledge of those skilled in the art. All such modified embodiments are also intended to fall within the scope of the present invention.

Figure 6:
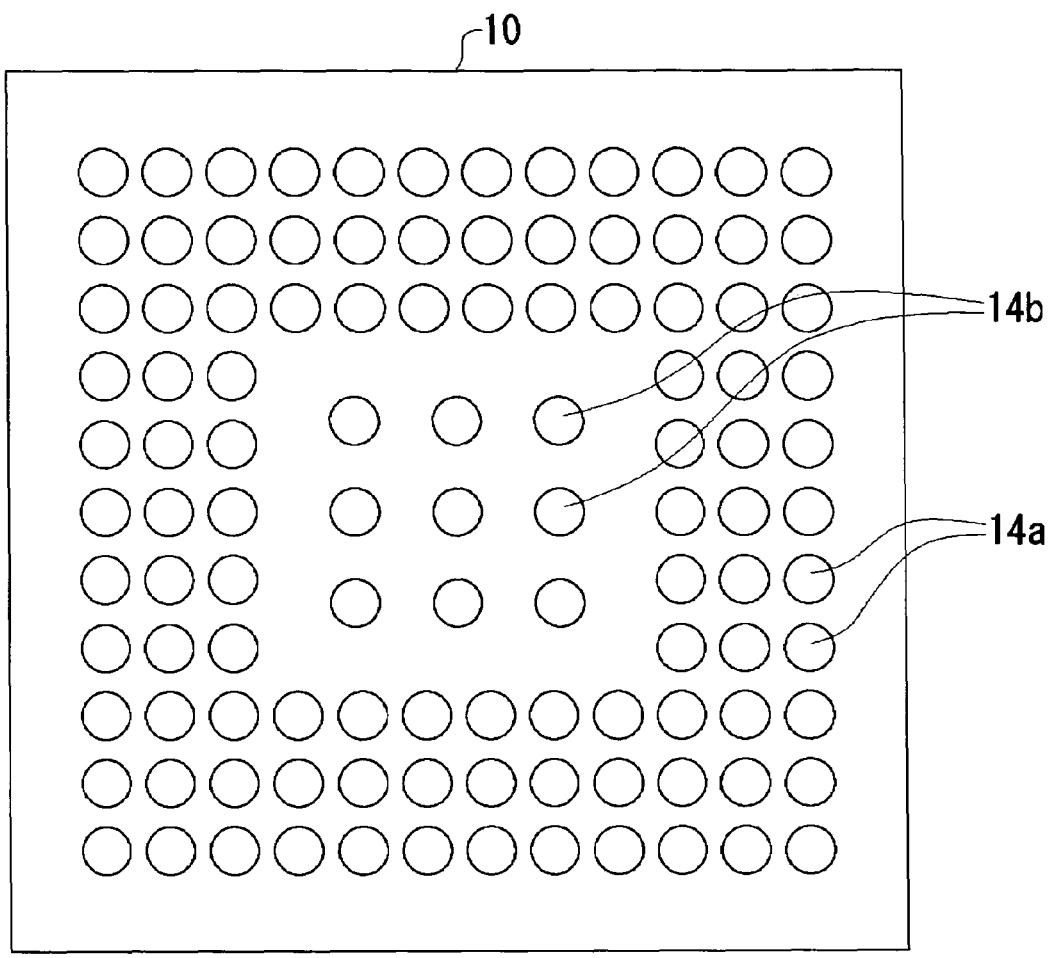
FIG. 6 is a plan view of a semiconductor chip according to a modification, showing the surface of the semiconductor chip on which electrode terminals are formed.

For example, in the foregoing embodiments, the protruding electrodes 14 are arranged in a line along each of the four sides of the semiconductor chip 10. However, the protruding electrodes 14 are not limited to this arrangement. As shown in FIG. 6, the protruding electrodes 14a may be arranged in an array in the peripheral areas of the semiconductor chip 10 while the protruding electrodes 14b are formed in the center area of the semiconductor chip 10 with a spacing greater than that of the protruding electrodes 14a. In this case, the wiring board (not shown) is provided with electrode pads and solder pieces corresponding to the arrays of the protruding electrodes 14a and 14b such that the solder pieces corresponding to the protruding electrodes 14b have a melting point lower than that of the solder pieces corresponding to the protruding electrodes 14a. Consequently, even in the connection structure where a greater number of protruding electrodes 14a adjoin each other and would normally increase the possibility of bridging, the semiconductor chip 10 can be mounted on the wiring board with greater reliability due to the improved alignment precision brought about by the self alignment described herein.

What is claimed is:

1. A wiring board for mounting an electronic component having a plurality of protruding electrodes formed at different spacings on the same side of the component, the wiring board comprising:
    electrode pads corresponding to the protruding electrodes; and
    solder pieces formed on the electrode pads, wherein
    the solder pieces on electrode pads of greater spacing have a melting point lower than that of the solder pieces on electrode pads of smaller spacing.

2. The wiring board according to claim 1, wherein
    some or all of the electrode pads of greater spacing are used only to fix the electronic component, and not to establish electrical connection with the electronic component.

3. The wiring board according to claim 1, wherein
    the electronic component is a semiconductor chip of flip chip mounting type.

4. An electronic component mounting structure including a wiring board and an electronic component mounted thereon wherein:
    a plurality of protruding electrodes formed on the same side of the electronic component at different spacings are joined to solder pieces on electrode pads formed on the wiring board so as to correspond to the respective protruding electrodes; and the solder pieces on electrode pads of greater spacing have a melting point lower than that of the solder pieces on electrode pads of smaller spacing and that of the protruding electrodes.

5. The electronic component mounting structure according to claim 4, wherein
some or all of the electrode pads of greater spacing are used only to fix the electronic component, and not to establish electrical connection with the electronic component.

6. The electronic component mounting structure according to claim 4, wherein
the electronic component is a semiconductor chip of flip chip mounting type which is mounted on the wiring board.

7. An electronic component mounting method comprising:
placing an electronic component on a wiring board, the electronic component having a plurality of protruding electrodes formed at different spacings on the same side of the component, the wiring board having electrode pads corresponding to the respective protruding electrodes and solder pieces formed on the respective electrode pads;
heating the electronic component and the wiring board to a temperature at which only the solder pieces on the electrode pads of greater spacing melt;
performing self alignment of the electronic component by means of the melted solder pieces; and
heating the electronic component and the wiring board further to a temperature at which the protruding electrodes and the solder pieces on the electrode pads of smaller spacing melt.

8. The electronic component mounting method according to claim 7, wherein
the method employs the wiring board in which some or all of the electrode pads of greater spacing are used only to fix the electronic component, and not to establish electrical connection with the electronic component.

9. The electronic component mounting method according to claim 7, wherein
the electronic component is a semiconductor chip of flip chip mounting type.

\* \* \* \* \*